(12) United States Patent
Lee et al.

(10) Patent No.: US 6,175,533 B1
(45) Date of Patent: Jan. 16, 2001

(54) MULTI-PORT MEMORY CELL WITH PRESET

(75) Inventors: Hyun Lee, Allentown; Mark Yeen Luong, Macungie, both of PA (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/291,158

(22) Filed: Apr. 12, 1999

(51) Int. Cl.[7] ........................................ G11C 8/00
(52) U.S. Cl. ........................ 365/230.05; 365/154
(58) Field of Search ........................ 365/230.05, 154, 365/129, 230.01

(56) References Cited

U.S. PATENT DOCUMENTS

| | | | | |
|---|---|---|---|---|
| 5,325,325 | * | 6/1994 | Azuma ............................. | 365/156 |
| 5,590,087 | * | 12/1996 | Chung et al. ...................... | 365/230.05 |
| 5,894,432 | * | 4/1999 | Lotfi ................................. | 365/154 |
| 5,901,079 | * | 5/1999 | Chiu et al. ......................... | 365/154 |

* cited by examiner

Primary Examiner—David Nelms
Assistant Examiner—Hoai V. Ho
(74) Attorney, Agent, or Firm—Duane, Morris & Heckscher LLP

(57) ABSTRACT

An integrated circuit includes a memory cell that stores a data bit corresponding to one of a low and a high voltage. A memory element is coupled to a data node for storing the data bit and to an inverse data node for storing an inverse of the data bit. At least one write-access port has a write-access switch having an input terminal coupled to a data input line, an output terminal coupled to the data node, and a control terminal coupled to a write control line for switching the write-access switch on or off to provide a write-data bit from the data input line to the write-access port. A preset switch is employed which has a first terminal coupled to one of the data node and the inverse data node, a second terminal coupled to a voltage source sufficient to cause the data node to store a logic-1 data bit when the preset switch is on, and a preset control terminal for switching the preset switch on or off to preset the memory cell before a write operation is coupled to a preset control line.

14 Claims, 2 Drawing Sheets

200

US 6,175,533 B1

MULTI-PORT MEMORY CELL WITH PRESET

BACKGROUND OF THE INVENTION

1. Field of the Invention

The present invention relates to memory cells and, in particular, to multiple access memory cells with multiple write- and read-access ports.

2. Description of the Related Art

Computer memory cells are in wide use today. They may be used, for example, in random-access memory (RAM), in registers, and other devices. Each memory cell stores a bit of data, i.e. a 0 (low, typically $V_{SS}$ or ground (0V)) or 1 (high, typically $V_{DD}$). New data may be written into the cell, and stored data may be read from the cell. A row of memory cells is typically used to provide storage of larger, multi-bit units of data such as bytes or words. An array of memory cells can provide a number of rows or words to provide multiple word storage.

Referring now to FIG. 1, there is shown a circuit diagram illustrating a prior art memory cell 100. Memory cell 100 comprises a flip-flop or memory element comprising inverters 101, 102, which may be implemented with two transistors each (one nmos and one pmos transistor). The flip-flop has data node D and inverse-data node DN (data-not, the inverse of D). Data node D stores a 1 or 0 corresponding to the data stored in memory cell 100.

Cell 100 comprises at least one data access port such as the data access port illustrated in FIG. 1, which allows a single external device or component such as a processor to write or read a bit to the cell, at a given time. The term data access port (or access port) is used to refer to both write and read data access ports, that is, a data access port used to perform a read or write of data. A data access port used to write data may be referred to as a write-access port, and a data access port used to read data may be referred to as a read-access port.

The data access port illustrated in FIG. 1 comprises nmos access transistors 105, 106, plus four input lines for the three signals BIT, $\overline{\text{BIT}}$, and WL (Word-Line), for purposes of writing a bit to or reading a bit from memory cell 100, from or to a single external device such as a processor. The memory cells of a given column of an array of memory cells typically share the same data access ports.

Cell 100 may be powered by a power supply voltage of, say, $V_{DD}$=3V. Nmos transistors such as transistors 105, 106 have a typical threshold drop of approximately 0.6V. Due to the threshold voltage of access transistor 105, the input signal on a single input line BIT may not be strong enough to write a 1 quickly enough, or even at all. For example, if cell 100 previously stored a 0 so that data node D was 0V, and a 1 is to be written to the cell by input line BIT, then a 1 (3V) on line BIT causes node D to raise from 0V to only 2.4V, because of the voltage drop of 0.6V across transistor 105. Increasing node D to 2.4V may be too low to quickly raise the cell to a 1 state from a 0 state, because it may be slow to overcome the current 0 state of the cell.

Even worse, with even lower supply voltages such as 1.2V, node D would only be raised to 0.6V, which is insufficient to guarantee that node D is pulled high quickly enough or even at all. With smaller and smaller supply voltages, because of the voltage drop of the access transistor of the data access port, a single input line is unable, in the prior art, to override the previous 0 state to write a 1 state.

Thus, two input lines, BIT and $\overline{\text{BIT}}$, are typically used to store the signal provided by the BIT line in a memory cell such as cell 100. To store a value in cell 100, signal WL goes high, and BIT provides the signal to be stored, while $\overline{\text{BIT}}$ provides the inverse of the BIT signal. In the case where D was is 0 from the previous memory state, and BIT carries a 1 (1.2V) to be stored in cell 100, $\overline{\text{BIT}}$ is 0V and so is node DN, because there is no voltage drop across transistor 106 when $\overline{\text{BIT}}$ is 0. A 0 or low signal at the input to inverter 102 causes inverter 102 to bring node D quickly up to 1. Thus, each write-access port requires two access transistors such as transistors 105, 106 plus four input lines carrying three input signals. For a write operation, the BIT signal is derived from the data signal provided by the processor writing into the cell. The $\overline{\text{BIT}}$ signal is provided by an inverter external to the memory cell array. The WL signal is provided by memory control logic which itself receives address information from the processor.

Similarly, the data access port may be used as a read-access port. In this case access transistors 105, 106 serve as read-access transistors. To read the state or bit of cell 100, an output line coupled to each of the BIT and $\overline{\text{BIT}}$ terminals has to be precharged. Then, the read-access transistors 105, 106 are turned on, allowing the cell to discharge one of the two precharged lines, depending on whether the cell is high or low. When a line is discharged, external circuitry can detect this and thus will be able to tell whether the memory cell 100 has a 0 or 1 stored therein.

Other memory cells in the same column (bit position) as cell 100 comprise a similar data access port and are coupled to the same BIT and $\overline{\text{BIT}}$ lines for the port. Thus, it is not possible for a single processor to access cell 100 and another cell in the same column but in a different row (word) using the same port, at the same time. For this reason, each processor is typically coupled to at least two ports per memory cell, so that it can access one cell using one of the two ports and access the other cell using the other port. The processor itself has at least two data ports by which it couples to the two different memory ports of each memory cell. This means that each processor is coupled by its two data port lines to each memory cell column, and each cell has 8 port lines or terminals for the processor.

Memory cells are often implemented in computer systems having multiple processors or other units, each of which may need to simultaneously read from and/or write into the array of memory cells. For example, each of four processors may need to write or read from four different words or rows of the memory cell array. Alternatively, one or more processors may wish to read simultaneously from the same cell while it is being written by another processor. There is thus a need for multiple access memory cells, that is, memory cells with sufficient read and write data access ports to allow multiple external units such as processors to be able to simultaneously read from and/or write to the memory cell array.

As explained previously, each memory cell may require 2 access ports (i.e., 4 access transistors and 8 terminals) for each processor. Thus, for multiple processors, each memory cell requires two access ports and 8 terminals per processor. For example, If 4 processors are to be able to access cell 100, this requires 4×2=8 ports (i.e. 4×4=16 access transistors and 4×8=32 signal terminals) per memory cell.

One problem with this conventional memory cell design is that many transistors and terminals must be added for each additional data access port and processor of the system. The large number of access port transistors and terminals increases chip (and PCB) area and power consumption. The necessity of precharging two read lines and of always discharging one of the two for each read also consumes a large amount of power. Further, during a write-through operation, where one processor writes cell 100 while another processor simultaneously reads the data being written to memory cell 100 via a second access port, the load on nodes D and DN imposed by the second access port can slow down the speed of writing the new data to the cell.

SUMMARY

An integrated circuit includes a memory cell that stores a data bit corresponding to one of a low and a high voltage. A memory element is coupled to a data node for storing the data bit and to an inverse data node for storing an inverse of the data bit. At least one write-access port has a write-access switch having an input terminal coupled to a data input line, an output terminal coupled to the data node, and a control terminal coupled to a write control line for switching the write-access switch on or off to provide a write-data bit from the data input line to the write-access port. A preset switch is employed which has a first terminal coupled to one of the data node and the inverse data node, a second terminal coupled to a voltage source sufficient to cause the data node to store a logic-1 data bit when the preset switch is on, and a preset control terminal for switching the preset switch on or off to preset the memory cell before a write operation is coupled to a preset control line.

DESCRIPTION OF THE PREFERRED EMBODIMENT

Figure 2:
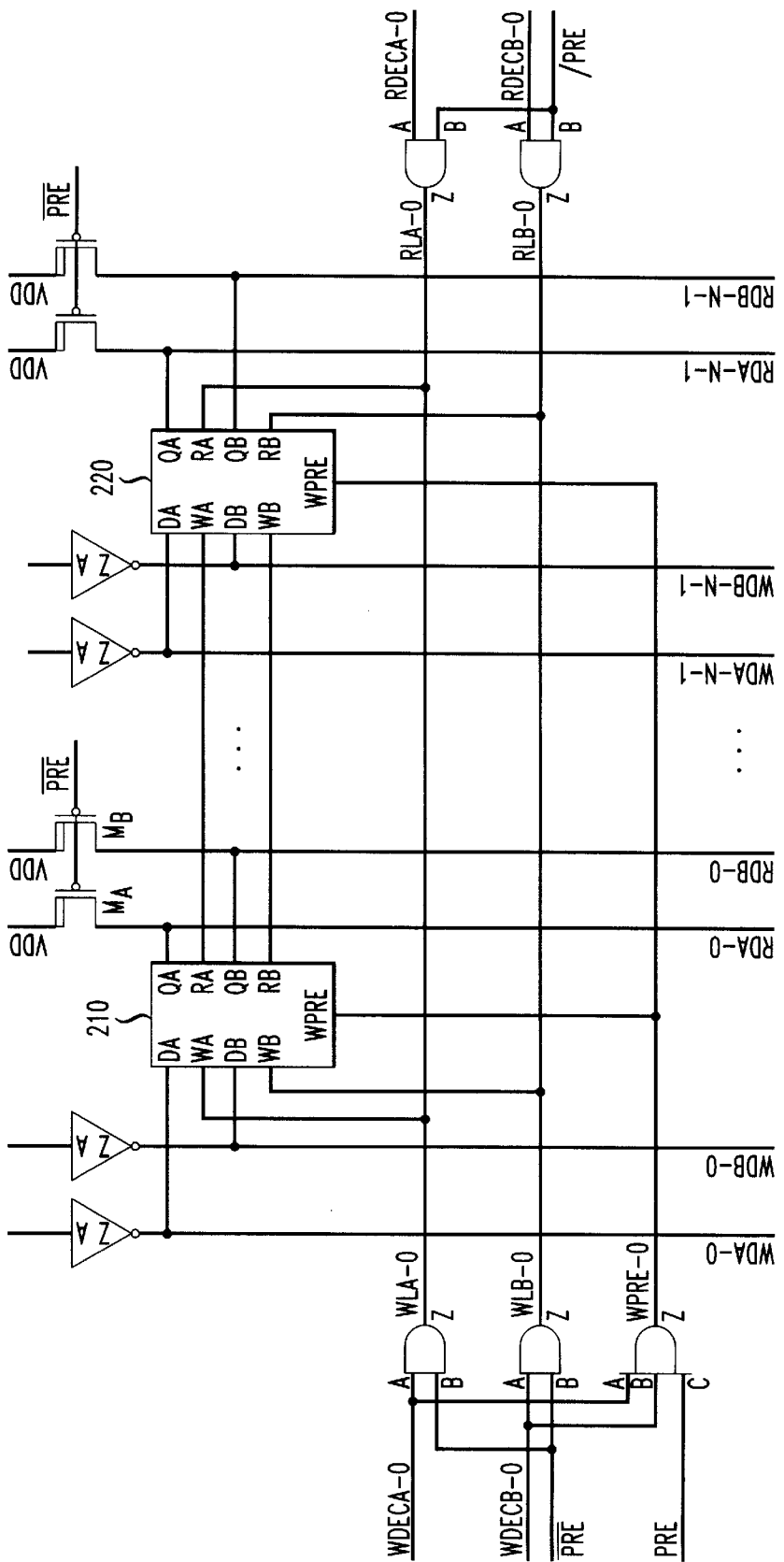
FIG. 2 is a block diagram of a memory cell system, in accordance with an embodiment of the present invention.

Referring now to FIG. 2, there is shown a block diagram of a memory cell system 200, in accordance with an embodiment of the present invention. System 200 comprises an array of memory cells, such as identical memory cells 210, 220. These memory cells may be part of an array, e.g. a 32-bit wide array (N=32) for 32-bit words, and, for example, 100 words deep. Cells 210,220 are thus first (column 0) and last (column N-1) memory cells of the first memory word (row 0) of such an array.

Figure 1:
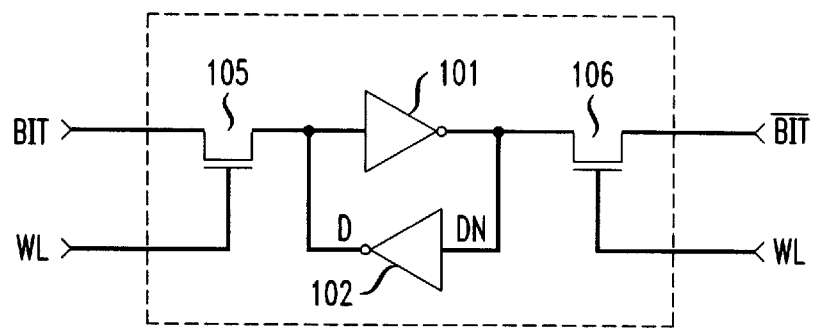
FIG. 1 is a circuit diagram illustrating a prior art memory cell.

Each memory cell, such as cells 210, 220, of the array of memory cells of system 200, comprises four independent data access ports, namely two write-access ports and two read-access ports. These are unidirectional ports as opposed to the bidirectional (read or write) access ports of prior art memory cell 100 of FIG. 1. As described in further detail below, each additional data access port of the present invention requires only a single access transistor and two terminals or signal lines, as opposed to a pair of access transistors for each data access port in prior art cell 100. The first and second write-access ports of each memory cell of system 200 are associated with terminals DA and WA, and DB and WB, respectively; and the first and second read-access ports are associated with terminals QA and RA, and QB and RB, respectively. Thus, the four data access ports of each cell such as cell 210 may be referred to by their associated terminals, viz. as data access ports DA/WA, DB/WB, QA/RA, and QB/RB. In one embodiment, system 200 comprises two processors A and B, but may alternatively comprise up to four independent processors A1, B1, A2, B2, as described in further detail below.

System 200 comprises a variety of input and output signal lines and related control logic. In general, the vertical lines are signals to or from various processors which read and write from/to the memory cells, and the horizontal lines carry signals from memory control logic. In particular, in system 200, there are two processors A and B (not shown), and N memory cells in each row, so that each row of memory cells stores a word of N bits. Processor A (not shown) provides signals such as write data signal WDA-0 and write data signal WDA-N-1, and accepts read data signal RDA-0 and read data signal RDA-N-1. Conversely, processor B (not shown) provides and reads signals such as WDB-0, RDB-0, WDB-N-1, and RDB-N-1.

Memory control logic (not shown) provides signals such as preset signal PRE and the inverse of PRE, $\overline{PRE}$, write decode signals WDECA-0 an WDECB-0, and read decode signals RDECA-0 and RDECB-0. These signals are provided by the memory control logic in response to address information provided by the processor accessing the memory. Further AND gates, as illustrated, are used to derive from these memory control signals the actual control signals for the row, such as, for row 0, read and write word signals WLA-0, WLB-0, RLA-0, and RLB-0, and write preset signal WPRE-0.

Because each row comprises a data word, each memory cell in a given row is read from and written to in the same operation, in parallel. Thus, each cell of a row is coupled to the same control signal lines such as, for row 0, read and write word lines WLA-0, WLB-0, RLA-0, and RLB-0, and write preset signal WPRE-0. These signals are coupled, respectively, for each memory cell, to the memory cell's input terminals WA, WB, RA, RB, and WPRE.

However, each memory cell of a given row is in a different column (i.e., represents a different bit of the data word represented by the row), and thus receives different data-in signals and provides different data-out signals so that an entire word of data may be written or read in parallel. Thus, the first memory cell 210 of the row (as well as the first memory cell of all other rows of the array) is coupled to write data signals WDA-0 and WDB-0 (where A and B represent whether the signal comes from processor A or B, where each processor A and B can both read and write from each memory cell; and the 0 represents that memory cell 210 is in column 0), and read data signal RDA-0 and RDB-0. Data bits to be stored in memory cell 210 are provided by external processors A or B on write data signal lines WDA-0 and WDB-0. A data bit provided on a write data signal line and which is to be written in a memory cell may be referred to as a write-data bit.

The data bit previously stored in memory cell 210 is read out by external processors A or B on read data signal lines RDA-0 and RDB-0. These signal lines are coupled, respectively, to the memory cell's data terminals DA, DB, QA, and QB, where DA and DB are data input terminals and QA and QB are data output terminals. Memory cell 220 is coupled similarly to a different set of lines for the Nth bit of a word. The other N-2 memory cells of the row (not shown) are coupled to their own four write and read data signal lines. A data bit stored previously in a memory cell and provided on a read data signal line by the memory cell to be read by a processor may be referred to as a read-data bit.

As explained previously, each memory cell of system 200 comprises four separate and independent data access ports, i.e. two write-access and two read-access ports. In one embodiment, the first write and read data ports DA/WA, QA/RA may be used by the same processor A; and the second write and read data ports DB/WB, QB/RB may be used by the same processor B. (Alternatively, four different processors, such as processors A1, B1, A2, B2, may use these ports.)

Figure 3:
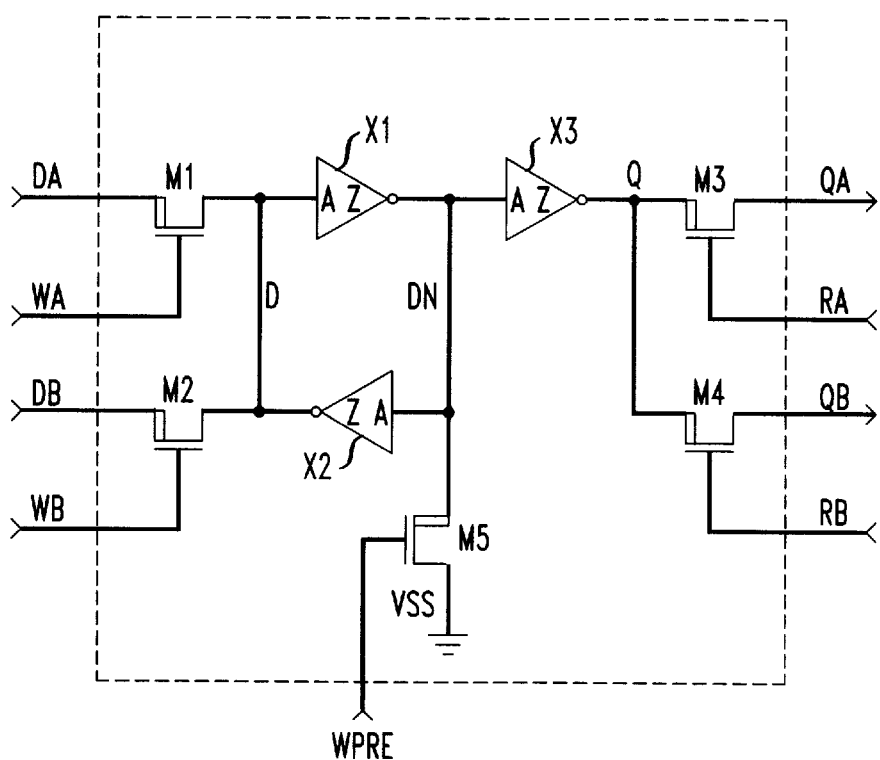
FIG. 3 is a circuit diagram illustrating a memory cell of the system of FIG. 2 in further detail, in accordance with an embodiment of the present invention.

Referring now to FIG. 3, there is shown a circuit diagram illustrating memory cell 210 of system 200 of FIG. 2 in further detail, in accordance with an embodiment of the present invention. Preferably, each memory cell of system 200 is configured identically to memory cell 210. In the present invention, only a single access transistor and pair of terminals are required for each additional data access port (whether it is a read- or write-access port). This is accomplished by employing a single precharge or preset transistor (M5) and its write preset signal input line WPRE. Preset transistor M5 is used to precharge node DN to 0V (logic-0) before a write operation, as described in further detail below.

Memory cell 210 comprises two write-access ports DA/WA, DB/WB (associated with nmos write-access transistors M1, M2, respectively, and their four respective input terminals DA/WA, DB/WB) and two read-access ports QA/RA, QB/RB (associated with nmos read-access transistors M3, M4 and their four respective signal terminals QA/RA, QB/RB). Each write-access port comprises a single write-access transistor such as transistor M1, which is coupled to a data line such as DA, and a write line such as WA. Each write-access transistor functions as a switch having an input terminal (coupled to the input data bit on line DA or DB), an output terminal coupled to node D, and a gate (or switch control) terminal coupled to write line WA or WB. Thus, the write line signal coupled to the gate terminal serves to switch the write-access transistor or switch on or off, where the input terminal of the write-access transistor is coupled directly to the output terminal of the write-access transistor when the gate signal goes high.

Each read-access port comprises a read-access transistor such as transistor M3, which is coupled to an output data line such as QA, and a read-line such as RA. Each read-access port is not coupled directly to node DN or D, but rather to the output of inverter buffer X3, which provides the same state as that of cell node D. Each read-access transistor also functions as a switch having an input terminal (coupled to the stored bit at the Q terminal), an output terminal coupled to output data line QA or QB, and a gate (or switch control) terminal coupled to read line RA or RB. Thus, the read line signal coupled to the gate terminal serves to switch the read-access transistor or switch on or off, where the input terminal of the read-access transistor is coupled directly to the output terminal of the read-access transistor when the gate signal goes high.

Memory cell 210 also comprises inverters (inverting buffers) X1, X2, and X3. Inverters X1 and X2 form the flip-flop which converges on a stable state to store a logic 1 or 0 (at data note D; its inverse is stored at data-not node DN). Inverter X3 inverts the DN signal to provide at node Q the same state as at node D, i.e. the bit stored in memory cell 210. Node Q is used to couple to read-access transistors M3, M4, and may be referred to as a read-access node.

In an alternative embodiment, buffer X3 is coupled at its input terminal to node D instead of to node DN. In this case the inverse data bit stored at node D and in memory cell 210 is provided at node Q and is read out on lines QA, QB. In another alternative embodiment, a non-inverting buffer is coupled at its input terminal to node D and at its output to node Q, instead of using inverting buffer X3. In this case the data bit stored at node D and in memory cell 210 is provided at node Q and is read out on lines QA, QB. In either embodiment, the data signal at node Q is either the same as data bit D or known to be the inverse thereof. Thus, in all embodiments, the data signal at node Q corresponds to (is related to in a known manner) the data bit D stored by the memory cell.

In order to write a bit to cell 210 on either of its two write-access ports, a memory cell preset phase is followed by a data write phase. In the memory cell preset phase, each memory cell of the row is preset with a logic-1 state. This state is either the correct state which is to be written, or, if not, is easily changeable to the other state (logic-0) by a single input signal on a write terminal such as terminal WA, without needing the inverse signal $\overline{BIT}$ also applied to cell 200, as is done in prior art cell 100.

Thus, to write to a cell, the cell is first preset to logic-1 in the memory cell preset phase. During this phase, the read and write word lines (WLA-0, WLB-0, RLA-0, and RLB-0) are held low, which causes the access transistors (M1, M2, M3, M4) to be turned off. If a particular row of cells is selected for write access (such as the row of cells shown in FIG. 2 and comprising cells 210, 220), the preset control signal PRE, which is ANDed with the write decode lines (WDECA-0 and WDECB-0), is activated which causes write preset signal WPRE-0 (where the 0 stands for row 0 of memory cells, the first word of an array of words) to go high and turn on the nmos preset transistor M5 of cell 210. Preset transistor MS functions as a switch having a first terminal coupled to ground, a second terminal coupled to inverse data node DN, and a gate (or preset switch control) terminal coupled to write preset control signal WPRE. Thus, the write preset control signal coupled to the preset gate or switch control terminal of transistor or switch M5 serves to switch the preset transistor or switch M5 on or off, so that node DN is coupled directly to ground when the write preset control signal goes high.

Thus, turning on preset transistor or switch M5 pulls node DN to 0 ($V_{SS}$), which causes node D to be pulled to high ($V_{DD}$) due to the operation of inverter X2. Thus, in the memory cell preset phase, each cell of a row of cells is preset to the logic-1 state (i.e., it is "precharged" since the D node is raised to the high voltage $V_{DD}$).

Next, the data write phase occurs. During this phase, the preset control signal PRE (and thus WPRE) is turned off, so that node DN is not coupled to ground, and the write access transistor (either M1 or M2 depending on whether processor A or B turns on write lines WLA-0 or WLB-0) is on. If the data from WDA-0 or WDB-0 applied to terminal DA or DB of cell 210 is logic-0 ($V_{SS}$), data node D is discharged to $V_{SS}$ through access transistor M1 or M2. However, if the data bit is logic-1 ($V_{DD}$), the data node D in cell 210 does not change. Thus, the necessity of using two access transistors per port and both BIT and $\overline{BIT}$ signals is eliminated.

A read operation also requires two phases, the read-line preset phase and the data read phase. In the read-line preset phase, the read access transistors M3 and M4 and preset transistor M5 are off. The read-data lines RDA-0, RDB-0, RDA-N-1, RDB-N-1 are pre-charged to logic-1 ($V_{DD}$) by transistors $M_A$, $M_B$, respectively, when these transistors are turned on by the $\overline{PRE}$ signal, as illustrated in FIG. 2. This initializes the read lines to be discharged when the line is to be read, by a logic-0 state at terminals QA, QB.

Next, in the data read phase, the read-line precharge is turned off by turning off signal $\overline{PRE}$, and read-access transistors M3 and/or M4 are turned on by signal RLA-0 and RLB-0 (coupled to internal terminals RA, RB, respectively), depending on whether processors A or B or both are reading the data word. Each read-data line is discharged to logic-0 ($V_{SS}$) only when the cell stores a logic-0 and when the corresponding read-access transistor is switched on; otherwise there is no discharge. The discharge or lack thereof may be detected by the processor data port coupled to the read-data lines, to determine the current bit stored in memory cell 210.

Thus, unlike the prior art cell 100, which requires both BIT and $\overline{\text{BIT}}$ lines for every data access port, the necessity of using $\overline{\text{BIT}}$ lines is eliminated yet without increasing the write/read access time of the memory cell, which normally increases when the number of memory cell transistors is reduced. Further, power dissipation is reduced by more than a factor of 2 by not having the BIT/$\overline{\text{BIT}}$ line pairs, one of which needs to be discharged at every read/write operation. The memory cell design of cell 210 also can be implemented in a smaller size than prior art cell 100 because the BIT/$\overline{\text{BIT}}$ line pairs are not needed for each access port; rather, only a single data line (DA, DB, QA, or QB) is needed per access port. In addition, the present invention can be implemented with a very low voltage operation (e.g., $V_{DD}$=1.2V or 0.9V), because the normal access transistor voltage drop which poses a problem to single-line writes of logic-0 when the previous state was 1, does not pose a problem in the present invention due to the write-phase memory cell preset. The present invention also has a faster write-through access than conventional cell 100, because the unidirectional, dedicated read-access ports are coupled to node Q at the output of inverter buffer X3, rather than directly to nodes D or DN.

In an alternative embodiment, the same processors A and B need not be used to provide both read and write signals for the access ports. Two processors A1 and B1 may write data, for example, while two different processors A2 and B2 may read data from the memory cells. Thus, processors A1 and B1 may provide the write data signals WDA-i, WDB-i (where i represents any column of a row of memory cells) and two different processors A2 and B2 may provide the read data signals RDA-i, RDB-i. Additional read- or write-access ports may be added to each memory cell of system 200 to accommodate additional processors, as needed. For example, in a system having 2 processors which require read/write ability, 2 more processors which require only write ability, and 3 more processors which require only read ability, each cell requires 4 write-access ports and 5 read-access ports, as will be appreciated.

In another alternative embodiment, preset transistor M5 is a pmos transistor and is coupled between $V_{DD}$ and node D, instead of between ground (low) and node DN. Its gate is coupled to the inverse of write preset control signal WPRE, i.e. $\overline{\text{WPRE}}$. This allows node D to be raised directly to high when the write preset control signal goes high, in the memory cell preset phase. In either embodiment, preset transistor M5 is used to preset each cell of a row of cells to the logic-1 (high) state.

In a further alternative embodiment, a single nmos pull-down transistor is used instead of inverter buffer X3. In this embodiment, the gate terminal of the nmos pull-down transistor is coupled to inverse data node DN, the source terminal is coupled to node Q, and the drain terminal is coupled to ground. Before each read by either or both of read-access ports QA/RA, QB/RB, node Q is precharged to high prior to the read. Thus, if data node D is low then inverse data node DN is high, which is applied to the gate terminal of the pull-down transistor to turn on the transistor, thereby coupling node Q to ground and causing the read-data line to be discharged. Therefore, the low state on data node D may be detected by the discharge at node Q. If data node D is high, then inverse data node DN is low, which is applied to the gate terminal of the pull-down transistor and does not turn it on. Thus, node Q floats and remains at its previously pre-charged high state, and does not discharge the read-data line. Therefore, the high state on data node D may be detected by the lack of discharge at node Q.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit having an array of memory cells, each for storing a data bit corresponding to one of a low and a high voltage, each memory cell comprising:

(a) a memory element coupled to a data node for storing the data bit and to an inverse data node for storing an inverse of the data bit;

(b) at least one write-access port, each write-access port comprising a write-access switch having an input terminal coupled to a data input line, an output terminal coupled to the data node, and a control terminal coupled to a write control line for switching the write-access switch on or off to provide a write-data bit from the data input line to the write-access port; and (c) a preset switch having a first terminal coupled to the inverse data node, a second terminal coupled to a low voltage source sufficient to cause the data node to store a logic-1 data bit when the preset switch is on, and a preset control terminal for switching the preset switch on or off in response to a write preset signal applied thereto;

the integrated circuit further comprising memory control logic for generating the write preset signal such that the write preset signal switches the preset switch on before each write of a write-data bit to the memory cell via the write-access port to precharge the data node to the high voltage before writing the write-data bit to the memory cell, and for providing a write control signal to the write control line, after said preset switch precharges the data node, that switches on the write-access switch to write the write-data bit to the precharged data node.

2. The integrated circuit of claim 1, wherein:

the write-access switch of each write-access port is a CMOS write-access transistor;

the control terminal of the write-access transistor is a write-access transistor gate terminal;

the preset switch is a CMOS preset transistor; and the preset control terminal of the preset transistor is a preset transistor gate terminal.

3. The integrated circuit of claim 1, each memory cell further comprising:

(d) a buffer having an input terminal coupled to one of the data node and the inverse data node and having an output terminal for providing a buffered data bit corresponding to the data bit stored at the data node; and (e) at least one read-access port, each read-access port comprising a read-access switch having an input terminal coupled to the output terminal of the buffer, an output terminal coupled to a data output line, and a control terminal coupled to a read control line for switching the read-access switch on or off to provide the buffered data bit to the data output line.

4. The integrated circuit of claim 3, wherein:

the buffer is an inverting buffer; and the input terminal of the inverting buffer is coupled to the inverse data node, whereby the buffered data bit is equal to the data bit stored at the data node.

5. The integrated circuit of claim 3, wherein:

the write-access switch of each write-access port is a CMOS write-access transistor;

the control terminal of the write-access transistor is a write-access transistor gate terminal;

the preset switch is a CMOS preset transistor;

the preset control terminal of the preset transistor is a preset transistor gate terminal;

the read-access switch of each read-access port is a CMOS read-access transistor; and the control terminal of the read-access transistor is a read-access transistor gate terminal.

6. The integrated circuit of claim 1, wherein the memory element comprises a first inverter coupled at an input terminal to the data node and at an output terminal to the inverse data node and a second inverter coupled at an input terminal to the inverse data node and at an output terminal to the data node.

7. The integrated circuit of claim 1, wherein the first terminal of the preset switch is coupled to the inverse data node and the second terminal of the preset switch is coupled to a low voltage source.

8. The integrated circuit of claim 1, each memory cell further comprising:

(d) an nmos pull-down transistor having a gate terminal coupled to the inverse data node and a drain terminal coupled to ground, and a source terminal which is pulled down to ground when the data bit stored at the data node is low; and (e) at least one read-access port, each read-access port comprising a read-access switch having an input terminal coupled to the source terminal of the nmos pull-down transistor, an output terminal coupled to a data output line, and a control terminal coupled to a read control line for switching the read-access switch on or off to couple the source terminal of the nmos pull-down transistor to the data output line.

9. In an integrated circuit comprising an array of memory cells, each having a memory element coupled to a data node for storing a data bit corresponding to one of a low and a high voltage and coupled to an inverse data node for storing an inverse of the data bit, a method for writing a write-data bit to a memory cell of said array, the method comprising the steps of:

(a) generating, with memory control logic, a write preset signal;

(b) prechaging the data node to the high voltage with a preset switch having a first terminal coupled the inverse data node, a second terminal coupled to a low voltage source sufficient to cause the data node to store a logic-1 data bit when the preset switch is on, and a preset control terminal coupled to the write preset signal for switching the preset switch on in accordance with said write preset signal, wherein the memory control logic generates the write preset signal such that the write preset signal switches the preset switch on before each write of a write-data bit to the memory cell;

(c) providing the write-data bit to an input terminal of a write-access switch having an output terminal coupled to the data node; and (d) providing a write control signal To a control terminal of the write-access switch, after said data node is precharged, to switch the write-access switch on to write the write-data bit to the precharged data node.

10. The method of claim 9, wherein:

the write-access switch of each write-access port is a CMOS write-access transistor;

the control terminal of the write-access transistor is a write-access transistor gate terminal;

the preset switch is a CMOS preset transistor; and the preset control terminal of the preset transistor is a preset transistor gate terminal.

11. The method of claim 9, comprising the further steps of:

(e) providing, at the output terminal of a buffer having an input terminal coupled to one of the data node and the inverse data node, a buffered data bit corresponding to the data bit stored at the data node; and (f) providing a read control signal to a control terminal of a read-access switch having an input terminal coupled to the output terminal of the buffer and having an output terminal coupled to a data output line, to switch the read-access switch on to read the buffered data bit onto the data output line.

12. The method of claim 11, wherein:

the buffer is an inverting buffer; and the input terminal of the inverting buffer is coupled to the inverse data node, whereby the buffered data bit is equal to the data bit stored at the data node.

13. The method of claim 9, wherein the memory element comprises a first inverter coupled at an input terminal to the data node and at an output terminal to the inverse data node and a second inverter coupled at an input terminal to the inverse data node and at an output terminal to the data node.

14. The method of claim 9, comprising the further steps of:

(e) pulling down a read-access node to ground when the data stored at the data node is low with an nmos pull-down transistor having a gate terminal coupled to the inverse data node, a drain terminal coupled to ground, and a source terminal coupled to the read-access node; and (f) providing a read control signal to a control terminal of a read-access switch having an input terminal coupled to the read-access node and having an output terminal coupled to a data output line, to switch the read-access switch on to read the data bit at the read-access node onto the data output line.

* * * * *